United States Patent [19]

Ohzu

[11] Patent Number: 5,241,169
[45] Date of Patent: Aug. 31, 1993

[54] PHOTOELECTRIC CONVERSION DEVICE HAVING AN IMPROVED CONTROL ELECTRODE STRUCTURE AND APPARATUS EQUIPPED WITH SAME

[75] Inventor: Hayao Ohzu, Fuchu, Japan

[73] Assignee: Canon Kabushiki Kaisha, Tokyo, Japan

[21] Appl. No.: 848,652

[22] Filed: Mar. 9, 1992

Related U.S. Application Data

[63] Continuation of Ser. No. 615,146, Nov. 19, 1990, Pat. No. 5,124,544.

[30] Foreign Application Priority Data

Nov. 21, 1989 [JP] Japan ................... 1-300718
Nov. 8, 1990 [JP] Japan ................... 2-301171

[51] Int. Cl.$^5$ .............................................. H01J 40/14
[52] U.S. Cl. ................................ 250/208.1; 257/443
[58] Field of Search ............ 250/211 J, 208.1, 214.1; 257/443, 462; 358/213.11, 213.12, 213.27, 213.28

[56] References Cited

U.S. PATENT DOCUMENTS

| | | | |
|---|---|---|---|
| 4,079,405 | 3/1978 | Ohuchi et al. | 357/30 |
| 4,301,477 | 11/1981 | Takemoto et al. | 358/213 |
| 4,723,129 | 2/1988 | Endo et al. | 346/1.1 |
| 4,740,796 | 4/1988 | Endo et al. | 346/1.1 |
| 4,791,469 | 12/1988 | Ohmi et al. | 357/30 |
| 4,794,443 | 12/1988 | Tanaka et al. | 357/43 |
| 4,810,896 | 3/1989 | Tanaka et al. | 250/578 |
| 4,814,846 | 3/1989 | Matsumoto et al. | 357/30 |
| 4,816,889 | 3/1989 | Matsumoto | 357/30 |
| 4,831,454 | 5/1989 | Tanaka et al. | 358/213.31 |
| 4,866,293 | 9/1989 | Nakamura et al. | 250/578 |
| 4,879,470 | 11/1989 | Sugawa et al. | 250/578 |
| 4,916,512 | 4/1990 | Ohmi et al. | 357/30 |
| 4,962,412 | 10/1990 | Shinohara et al. | 357/30 |
| 5,124,544 | 6/1992 | Ohzu | 250/211 J |

FOREIGN PATENT DOCUMENTS

| | | |
|---|---|---|
| 260858 | 3/1988 | European Pat. Off. |
| 0277016 | 8/1988 | European Pat. Off. |
| 2450012 | 9/1980 | France . |
| 63-076476 | 4/1988 | Japan . |

Primary Examiner—David C. Nelms
Assistant Examiner—John R. Lee
Attorney, Agent, or Firm—Fitzpatrick, Cella, Harper & Scinto

[57] ABSTRACT

Disclosed is a photoelectric conversion device which is adapted to accumulate optically generated carriers in the control electrode region of a transistor and to read a signal on the basis of the carriers thus accumulated. This photoelectric conversion device is so designed that the substantial size of the control electrode region is augmented at the time of carrier accumulation. In this device, a region of the same conductivity type as the control electrode region is formed at the time of accumulation and is electrically connected to the control electrode region. During accumulation, carriers, generated by light, are accumulated in the above-mentioned region which is of the same conductivity type as the control electrode region. At the time of signal reading after accumulation, the above-mentioned region which is of the same conductivity type as the control electrode region is made to disappear and the carriers that have been accumulated therein are transferred to the control electrode region. Also, disclosed is an apparatus which is equipped with a photoelectric conversion device as described above.

11 Claims, 7 Drawing Sheets

PHOTOELECTRIC CONVERSION DEVICE HAVING AN IMPROVED CONTROL ELECTRODE STRUCTURE AND APPARATUS EQUIPPED WITH SAME

This application is a continuation of application Ser. No. 07/615,146 filed Nov. 19, 1990, now U.S. Pat. No. 5,124,544.

BACKGROUND OF THE INVENTION

1. Field of the Invention

The invention relates to a photoelectric conversion device which is to be used in an image information processing apparatus, such as a facsimile apparatus, an image scanner, or a video camera, or in a photometric apparatus, such as a camera, and in particular, to a photoelectric conversion device which is adapted to accumulate optically generated carriers in the control electrode region of a transistor and to read a signal on the basis of the carriers thus accumulated.

2. Related Background Art

Examples of conventional photoelectric conversion devices are disclosed in U.S. Pat. No. 4,791,469 granted to the inventor Tadahiro Ohmi, et al., U.S. Pat. No. 4,810,896 granted to the inventor Nobuyoshi Tanaka, et al., European Patent Laid-Open Publication No. EP0260858, Japanese Patent Laid-Open No. 63-076476 (which is a counterpart to the above European patent laid-open publication), etc.

The photoelectric conversion devices proposed in these publications are of the type in which an output circuit including a capacitance load is connected to the emitter of a phototransistor and in which a photoelectric conversion signal voltage based on optically generated carriers that are accumulated in the base of this phototransistor is read from the capacitance load connected to the emitter.

In the following, this conventional type of photoelectric conversion device will be briefly described with reference to FIGS. 1A to 2.

FIG. 1A is a plan view of a photoelectric conversion device with the above-described conventional structure; FIG. 1B is a sectional view taken along the line I—I of FIG. 1A; and FIG. 2 is an equivalent circuit diagram of this conventional photoelectric conversion device.

In FIG. 1, the reference numeral 1 indicates an n-type semiconductor substrate. The reference numerals 3, 4 and 5 indicate an epitaxial layer of an $n^-$-type semiconductor, a base layer of a p-type semiconductor, and an emitter layer of an $n^+$-type semiconductor, respectively. The reference numerals 7 and 8 indicate a field insulating film and an emitter electrode, respectively. The reference numerals 23 and 24 indicate an $n^+$-type semiconductor having the functions of device isolation and ohmic contact, and a collector electrode, respectively. The above-mentioned components form a basic phototransistor. The reference numerals 25 and 26 indicate insulating films, and the reference numeral 27 indicates a shielding film.

As shown in FIGS. 1A and 1B, the base layer 4 of a p-type semiconductor (hereinafter referred to as the "p-type base layer"), which constitutes the control electrode region of the bipolar transistor Tr, is formed in the area around the emitter layer 5 of an $n^+$-type semiconductor (hereinafter referred to as the "$n^+$-type emitter layer"), in the opening area L, and in the area in the vicinity of the opening area L. When light impinges upon that portion of the p-type base layer 4 which is in the opening area L, this portion gathers and accumulates carriers that are generated mainly in the epitaxial layer 3 of an $n^-$-type semiconductor (hereinafter referred to as the "$n^-$-type epitaxial layer").

In the following, a brief explanation will be given of the basic operations of such a photoelectric conversion device, i.e., the resetting, accumulation and reading.

First, in the resetting operation, the p-type base layer 4, which constitutes the control electrode region, is reset by means of a p-channel MOS transistor RT, which is composed of a source region 20, a drain region 21, and a gate electrode 22. Through this resetting, the device is initialized for the accumulation of carriers.

Next, in the accumulating operation, carriers generated mainly in the $n^-$-type epitaxial layer 3 having depletion layers are gathered in the p-type base layer 4 formed in the opening area L and are accumulated therein. An accumulation voltage is generated in this p-type base layer 4.

In the reading operation, the accumulation voltage generated in the p-type base layer 4 is read from the emitter of the bipolar transistor Tr as the output voltage.

Afterwards, the device goes back to the resetting operation, repeating the above series of operations.

Although the above-described photoelectric conversion device, which is of a charge amplification type, provides high sensitivity, it leaves much room for improvement before it can achieve such a high sensitivity as is desired today. In view of this, numerous experiments have been repeatedly conducted and the results thereof have been examined finding a fundamental problem to be solved, which will be described below.

In the above-described conventional photoelectric conversion device, the p-type base layer 4, which is formed in the opening area L and which constitutes the control electrode region, generates a junction capacitance Cbc in the border section between it and the $n^-$-type epitaxial layer 3, which constitutes the collector. The generation of this junction capacitance causes the parasitic capacitance of the control electrode region to be augmented, with the result that the accumulation voltage generated by the accumulation of carriers is lowered. If the accumulation voltage thus lowered is supplied to the emitter of the bipolar transistor Tr, the output voltage at this emitter will be accordingly low. This has been one of the factors preventing the output sensitivity of a photoelectric conversion device from being further improved.

SUMMARY OF THE INVENTION

This invention has been made in view of the above problem. It is accordingly a first object of this invention to provide a photoelectric conversion device whose sensitivity is higher than that of conventional photoelectric conversion devices.

Another object of this invention is to provide an apparatus such as an image information processing apparatus or a photometric apparatus which is equipped with a photoelectric conversion device with higher sensitivity and which is consequently capable of reading images with high resolution and in a clear manner.

Still another object of this invention is to provide a photoelectric conversion device of the type in which optically generated carriers are accumulated in the control electrode region of a transistor and in which a signal is read on the basis of the carriers thus accumulated, characterized in that it is equipped with a control means for augmenting the substantial size of the above-mentioned control electrode region at the time of carrier accumulation, as well as an apparatus equipped with this photoelectric conversion device.

As described with reference to FIGS. 1A and 1B, the control electrode region of a conventional photoelectric conversion device is used for the purpose of gathering and accumulating carriers generated in the opening area, and has been formed in the opening area and in the vicinity thereof. This has been one of the factors augmenting the parasitic capacitance of the control electrode region.

In a photoelectric conversion device in accordance with this invention, a control means is provided which forms in the opening area a region of the same conductivity type as the control electrode region at the time of accumulation and which electrically connects that region to the control electrode region.

With this construction, carriers generated by light impinging upon the opening area are accumulated in the above-mentioned region which is of the same conductivity type as the control electrode region.

When the accumulation has been completed and the reading operation, in which a signal is output, is started, the above-mentioned region which is of the same conductivity type as the control electrode region is made to disappear and the carriers that have been accumulated therein are transferred to the control electrode region.

With the photoelectric conversion device of this invention, the parasitic capacitance due to the presence of the control electrode region can be reduced, so that the output voltage is prevented from being lowered. Accordingly, the output sensitivity of the photoelectric conversion device can be enhanced.

DETAILED DESCRIPTION OF THE PREFERRED EMBODIMENTS

An embodiment of this invention will now be described in detail with reference to the accompanying drawings.

Figure 3A:
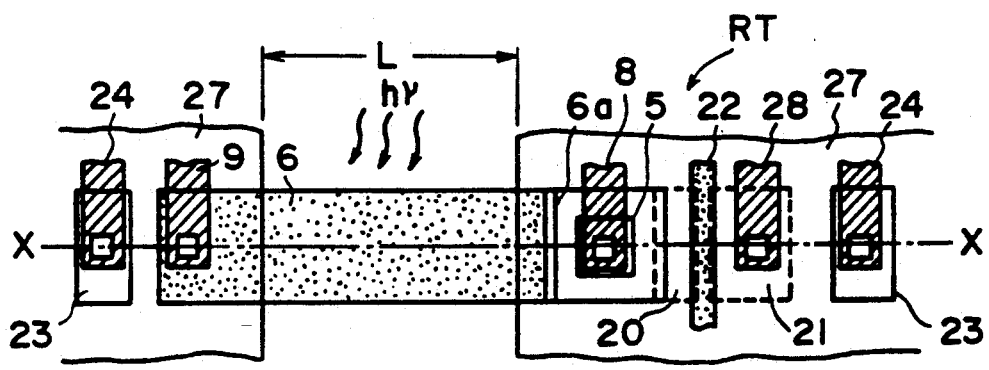
FIG. 3A is a plan view of a photoelectric conversion device in accordance with an embodiment of this invention.
Figure 3B:
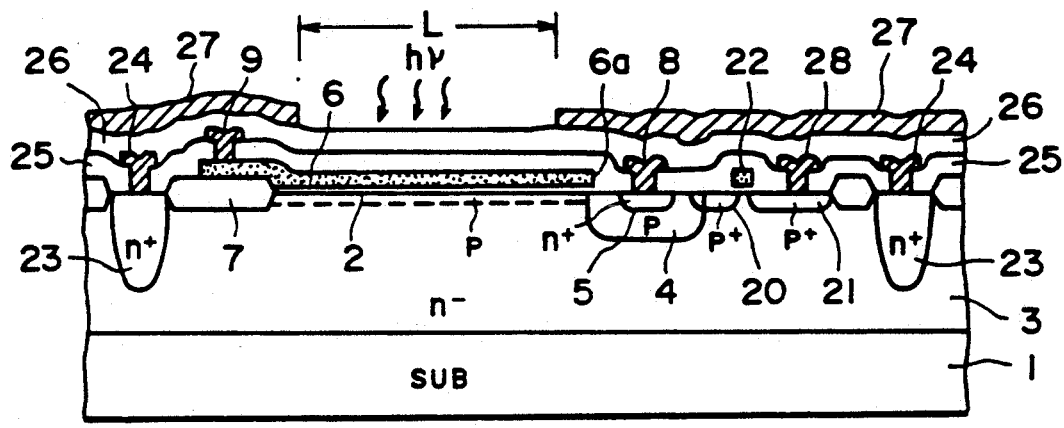
FIG. 3B is a sectional view taken along the line X—X of FIG. 3A.

FIG. 3A is a plan view of a photoelectric conversion device in accordance with an embodiment of this invention, and FIG. 3B is a sectional view taken along the line X—X of FIG. 3A.

Figure 4:
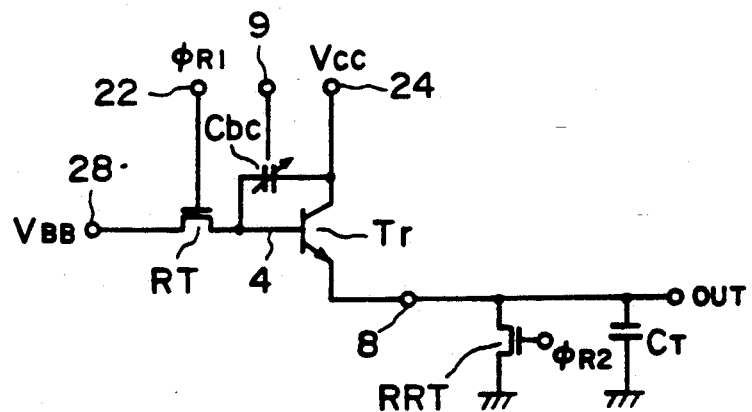
FIG. 4 is an equivalent circuit diagram of the photoelectric conversion device of this invention.

FIG. 4 is an equivalent circuit diagram of this photoelectric conversion device.

Figure 1A:
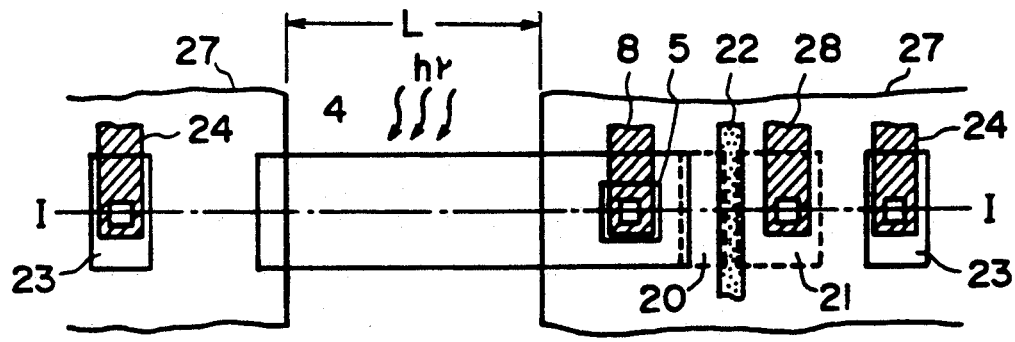
FIG. 1A is a plan view of a conventional photoelectric conversion device.
Figure 1B:
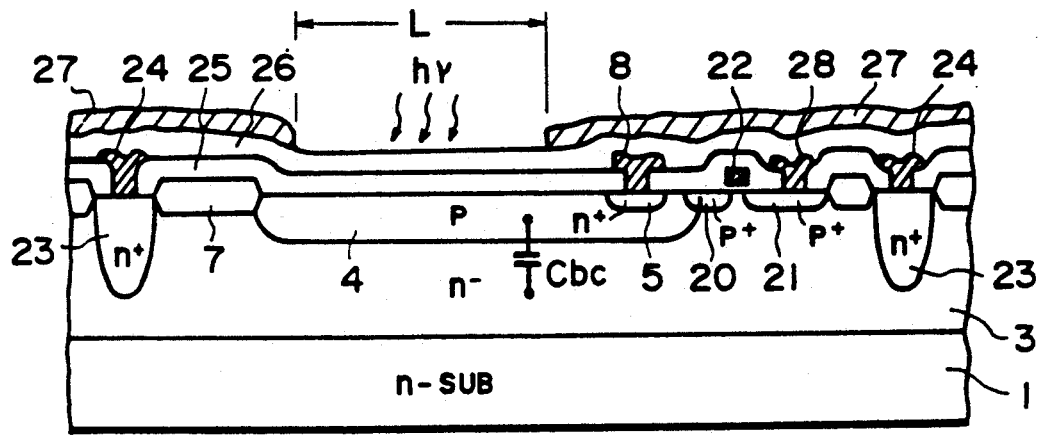
FIG. 1B is a sectional view taken along the line I—I of FIG. 1A.
Figure 2:
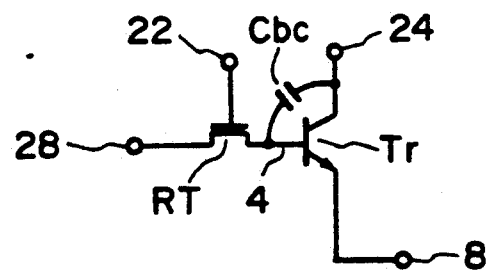
FIG. 2 is an equivalent circuit diagram of the conventional photoelectric conversion device.

These drawings are presented in contrast to FIGS. 1A, 1B and 2, and those components of this embodiment which are identical to those of the above-described conventional device are referred to by the same reference numerals.

As shown in FIGS. 3A, 3B and 4, the photoelectric conversion device of this invention includes an Si substrate 1, on which an $n^-$-type epitaxial layer 3 is formed. Provided on this $n^-$-type epitaxial layer 3 are a p-type base layer 4 serving as a control electrode region, and an $n^+$-type emitter layer 5, these layers forming a bipolar transistor Tr. In this embodiment, the p-type base layer 4 is formed only in the area around the $n^+$-type emitter layer 5. This area is shielded by a shielding layer 27. The reference numeral 8 indicates an emitter terminal. A conductive layer 6 of polysilicon is formed on that surface portion of the $n^-$-type epitaxial layer 3 which is within an opening area L, where the shielding layer 27 does not exist, through the intermediation of an insulating layer. One end portion 6a of the conductive layer extends up to a position over the p-type base layer 4, partly overlapping this p-type base layer 4. The conductive layer 6 is connected to control electrode wiring 9 so that its potential may be controlled. The connection is made at a position above a field oxide film 7. An $n^+$-type semiconductor region 23 is connected to collector electrode wiring 24, making it possible to apply a predetermined level of voltage to the $n^-$-type epitaxial layer 3, which constitutes a high resistance collector region.

The reference numerals 20, 21, and 22 respectively indicate the source region, the drain region, and the gate electrode of a p-channel MOS transistor. The reference numeral 28 indicates drain electrode wiring. Part of the $p^+$-region constituting the source region 20 overlaps the p-region constituting the base layer 4, the depth of this $p^+$-region being smaller than that of the p-region 4. Likewise, the depth of the drain region 21 is smaller than that of the p-region 4. The reference numerals 25 and 26 indicate insulating layers of silicon oxide. The reference numeral 27 indicates the above-mentioned shielding layer, which is made of Al or the like. Light $h\nu$ is allowed to impinge upon that semiconductor portion of the device which is exposed through the above-mentioned opening area L formed in this shielding layer 27.

Referring to FIG. 4, the collector of the bipolar transistor Tr is connected to a reference voltage source Vcc through collector wiring 24 so that it may be biased to a predetermined level of electrical potential.

The drain region 21 of the p-channel MOS transistor RT is connected to reference voltage source $V_{BB}$, and, by applying a resetting pulse $\phi_{R1}$ to the gate electrode 22, the base electrical potential of the bipolar transistor Tr can be set to a predetermined level.

Further, a resetting transistor RRT which is not shown in FIG. 3 is connected to the emitter of the bipolar transistor Tr, so that, when a resetting pulse $\phi_{R2}$ is applied to the gate of the transistor RRT, the emitter of the bipolar transistor Tr is connected to a reference voltage source. In the example shown, the ground potential is chosen as this reference voltage source. The emitter of the bipolar transistor Tr has a parasitic capacitance $C_T$ as the capacitance load.

The operation of the photoelectric conversion device of this embodiment will be schematically described with reference to FIG. 5.

A voltage ($V_1$) is applied to the device through the control terminal wiring 9, and, in the condition in which no p-type inversion layer forms, a LOW level signal is applied to the resetting pulse terminal $\phi_{R1}$ to turn ON the p-channel MOS transistor RT, thereby fixing the base electrical potential of the bipolar transistor Tr to $V_{BB}$.

Next, a HIGH level signal is applied to the resetting pulse terminal $\phi_{R2}$ to turn ON the transistor RRT, thereby grounding the emitter of the bipolar transistor, and the section between the base and collector is forward biased, thereby causing the carriers remaining in the base to disappear (these procedures constitute the resetting operation). Then, a voltage $V_2$ whose level is lower than that of the voltage $V_1$ is applied to the conductive layer 6 through the control terminal wiring 9 so as to form a p-type inversion layer, thereby effecting generation of carriers by signal light incidence and accumulation of the same (these procedures constitute the accumulating operation). Then, a voltage $V_1$ is applied to the device through the control terminal wiring 9 so as to cause the p-type inversion layer to disappear. Afterwards, reading is performed. At this time, a signal voltage which is based on the carriers accumulated in the base appears in the capacitance $C_T$ through the emitter (the reading operation).

Figure 5:
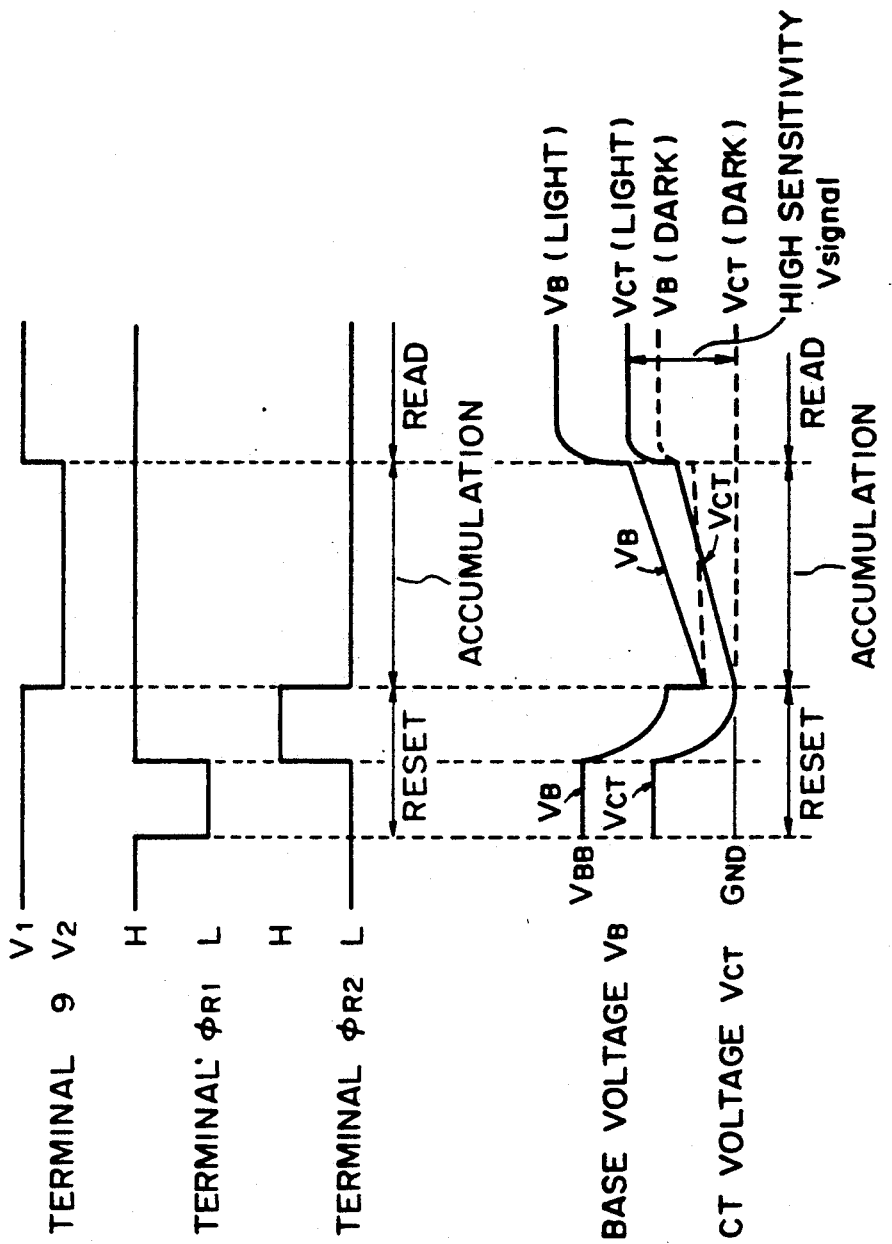
FIG. 5 is a timing chart for illustrating the basic operations of the photoelectric conversion device of this invention.
Figure 6A:
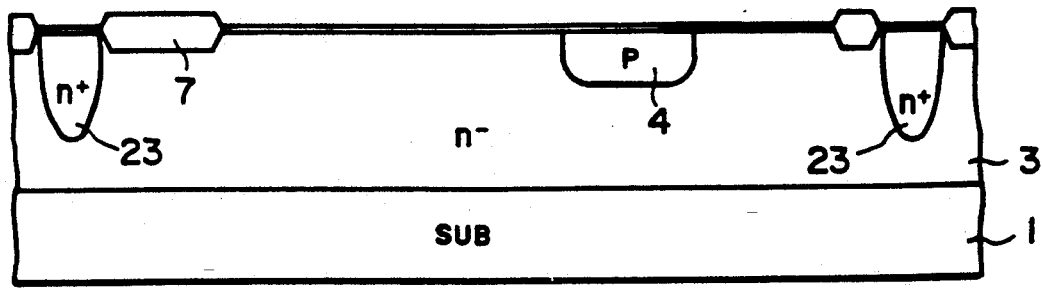
FIGS. 6A to 6E are sectional views for illustrating a method of manufacturing the photoelectric conversion device of this invention.
Figure 6B:
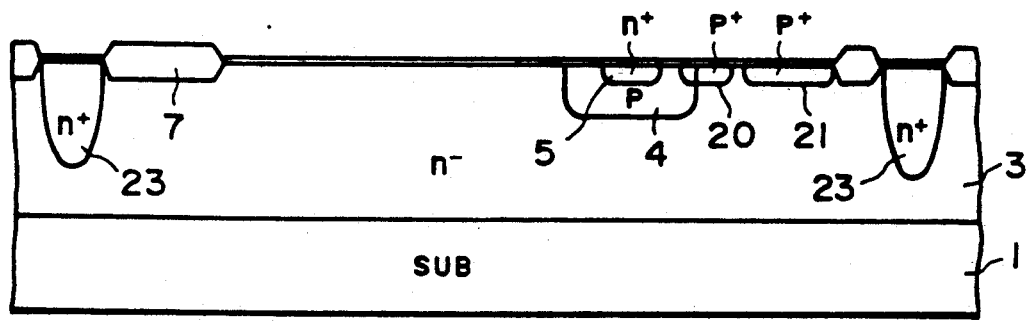
Figure 6C:
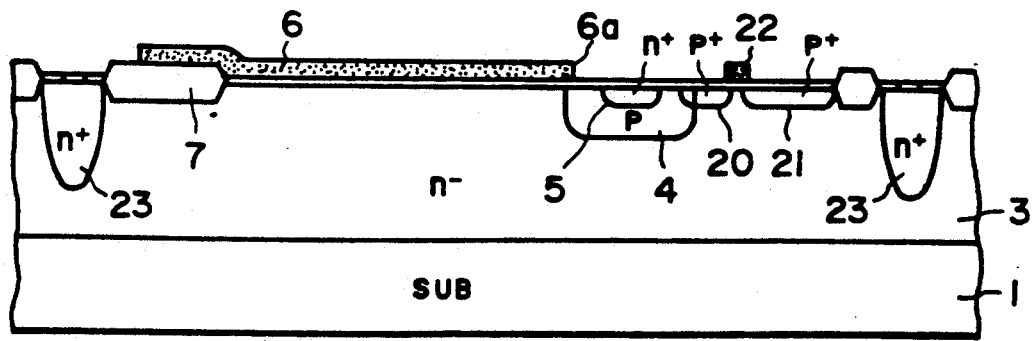
Figure 6D:
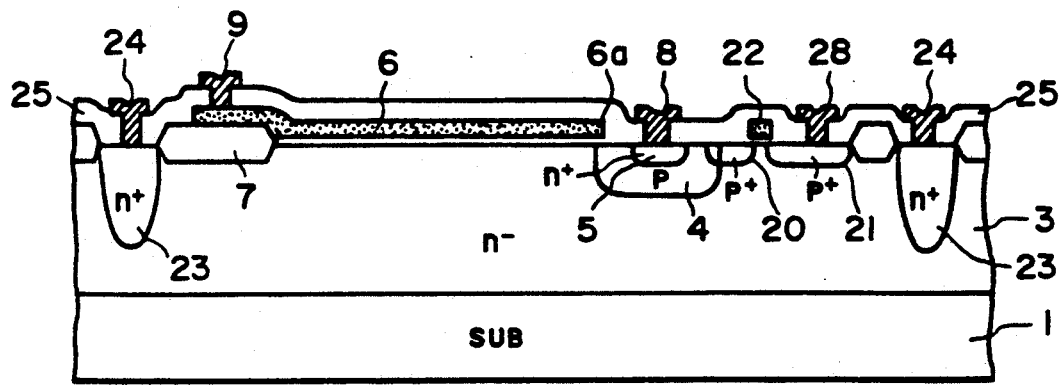
Figure 6E:
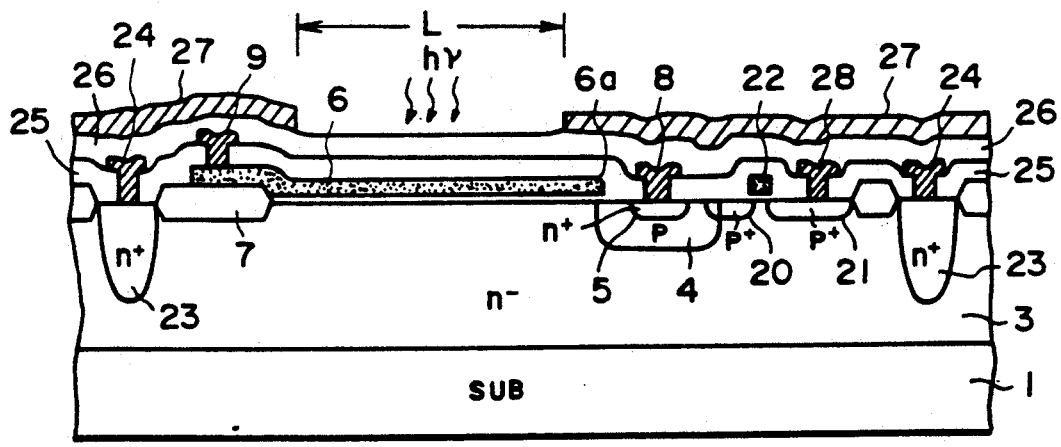

FIG. 5 shows the base potential $V_B$ and the emitter potential (CT potential) $V_{CT}$ when the above-described operation, i.e., the resetting, accumulation and reading, are being performed.

FIG. 5 shows these potentials in both the dark condition in which no light is applied to the device and the light condition in which light is applied thereto.

The greater the difference between the output voltage level in the dark condition and that in the light condition, the higher the photosensitivity of the device.

In this embodiment, the photosensitivity during reading is higher than that during accumulation, as can be seen by comparing the accumulation and the reading states, shown in FIG. 5, with each other. This comes from the fact that, as described above, the control electrode region, which has been present during accumulation, is caused to disappear in the reading operation so as to reduce the parasitic capacitance of the base.

Next, the operation of the photoelectric conversion device of this embodiment will be described in detail.

The potential of the conductive layer 6 is set at a predetermined level through the control terminal wiring 9 for the basic operations of the device except for the accumulating operation, in which carriers generated mainly in the $n^-$-type epitaxial layer by light applied through the opening area L are accumulated. That is, an electrical potential whose level is such that the surface of that portion of the $n^-$-type epitaxial layer 3 which is just below the conductive layer 6 is not inverted to p-type is imparted to the conductive layer 6.

First, through the resetting operation prior to the reading, the electrical potential of the p-type base layer 4 constituting the control electrode region is reset to $V_{BB}$ by the p-type MOS transistor RT, which is composed of the source region 20, the drain region 21, and the gate electrode 22. Subsequently, the emitter is connected to the ground potential by the transistor RRT, with the result that electric current flows between the base and emitter, setting the base potential to the initial level. In this way, the electrical potential of the p-type base layer 4 is set to a predetermined initial level, initializing the bipolar transistor for carrier accumulation.

Next, imparted to the conductive layer 6 by means of the control electrode wiring 9 is an electrical potential whose level is such that the surface of that portion of the $n^-$-type epitaxial layer 3 which is just below the conductive layer 6 is inverted to p-type so as to form in the opening area L a p-type inversion layer 2 which is of the same conductivity type as the p-type base layer 4 (5V, in this example).

The operation of accumulating carriers is started in this condition.

During the accumulation, the holes which are mainly generated in the $n^-$-type epitaxial layer 3 are gathered in the p-type inversion layer 2 formed on the surface of the above-mentioned portion of the $n^-$-type epitaxial layer 3 and are accumulated therein.

As a result, the base potential is augmented linearly during the accumulating operation. The voltage detection sensitivity at this time is determined by the parasitic capacitance of the base, which is composed of the p-type inversion layer and the p-type base layer.

When the accumulating operation has been completed, the potential of the conductive layer 6 is set, for example, at $+5V$ so that the surface of that portion of the $n^-$-type epitaxial layer 3 which is just below the conductive layer 6 may not be inverted to p-type. When the p-type inversion layer 2 disappears, all of the carriers that have been accumulated in this p-type inversion layer 2 are transferred to the p-type base layer 4, which constitutes the control electrode region, and are gathered there. The parasitic capacitance in the control electrode region at this time is smaller than that in the above-described conventional photoelectric conversion device shown in FIGS. 1A and 1B by the amount corresponding to the base/collector junction capacitance in the opening area L. As a result, the voltage detection sensitivity is improved, and the accumulation voltage generated in the control electrode region is remarkably higher than that in the above-described conventional photoelectric conversion device.

The accumulation voltage thus heightened is read as the output voltage from the capacitance load at the emitter of the bipolar transistor.

Afterwards, the device goes back to the resetting operation and the above series of procedures are repeated.

Thus, in the above embodiment of this invention, a region which is of the same conductivity type as the control electrode region is formed in the opening area only in that operational phase in which accumulation of carriers is effected, and, in the other operational phases, no control electrode region is formed in the opening area, so that the parasitic capacitance of the control electrode region when reading a signal is remarkably reduced, thereby making it possible to obtain a high accumulation voltage. As a result, the output voltage read is also high, thus realizing a highly sensitive output voltage.

Although in the above embodiment polysilicon is adopted as the material of the conductive layer 6, this should not be construed as restrictive. Any material will do as long as it enables the surface of the $n^-$-type epitaxial layer 3 to be controlled.

Specifically, the material may be a metal, such as Al, W, Mo, Cu, Ti, Ta, or Au, or a silicide of such a metal, or a light-transmitting conductive material, such as SnO$_2$ or ITO.

An appropriate flat configuration is selected for the conductive layer 6. It is desirable that this conductive layer 6 extend up to a position over the p-type base layer 4, which does not disappear at the time of reading, partly overlapping this base layer 4 through the intermediation of an insulating layer.

The inversion layer 2 may be lightly doped with a p-type impurity. This makes it possible to realize an inversion from p-type to n-type of the inversion layer 2 by applying a positive voltage thereto at the time of reading, in addition to the inversion from n-type to p-type effected by the application of a negative voltage at the time of accumulation.

The material of the dielectric layer, existing between the inversion layer 2 and the conductive layer 6, may be silicon oxide, silicon nitride, or silicon nitroxide. Alternatively, a film of PSG, BSG, or BPSG, which are obtained by doping the above-mentioned materials with P or B, may be used.

It goes without saying that the impurity density in the region where the inversion layer is formed, the thickness of the inversion layer, the material of the conductive layer, the level of the voltage applied, etc. may be appropriately selected taking into account the work function, the electric field effect, etc. of the material of the conductive layer, combining them with each other in an appropriate manner.

Further, this invention can also be applied to a case where, instead of a region of an inverted conductivity type or a bipolar transistor, a field effect transistor is adopted, using the gate electrode thereof as the control electrode.

Next, a method of manufacturing a photoelectric conversion device in accordance with this invention will be described with reference to FIGS. 6A to 6E.

First, an n-type semiconductor substrate 1 with an impurity density in the range of $10^{15}$ to $10^{16} cm^{-3}$ is prepared, and an n$^-$-type epitaxial layer 3 having an impurity density in the range of $10^4$ to $10^{15} cm^{-3}$ and having a thickness in the range of 5 to 10 μm is formed on this n-type semiconductor substrate 1 by epitaxial growth.

Subsequently, P-ions are implanted into the collector electrode extraction section and heat treatment of this section is conducted, thereby forming an n$^+$ layer 23 which has an impurity density which is in the range of $10^{14}$ to $10^{19} cm^{-3}$ and a depth ranging from 5 to 10 μm.

Likewise, B-ions are implanted into the section where the base layer is to be formed and heat treatment of this section is conducted, thereby forming a p-base layer 4. The impurity density of the p-base layer 4 is in the range of $10^{16}$ to $10^{17} cm^{-3}$ and its thickness is in the range of 0.5 to 1.2 μm. [FIG. 6A]

Then, B-ions are implanted into that section of a p-channel MOS transistor where the source and the drain regions are to be formed so as to form source and drain regions 20 and 21 whose impurity density is in the range of $10^{19}$ to $10^{21} cm^{-3}$ and whose thickness is in the range of 0.2 to 0.5 μm. Likewise, P-ions are implanted into that section of the p-channel MOS transistor where the emitter region is to be formed so as to form an emitter region 5 whose impurity density is in the range of $10^{19}$ to $10^{21} cm^{-2}$ and whose thickness is in the range of 0.3 to 0.7 μm. [FIG. 6B]

After thus forming active regions on the semiconductor substrate, a polysilicon film, i.e., the conductive layer, is formed, which is so patterned that one end portion thereof overlaps the field insulating film 7 and the other end portion thereof overlaps the p-type base layer 4. At this stage, the gate electrode 22 is also formed. [FIG. 6C]

Subsequently, the silicon oxide film 25 is formed by chemical vapor deposition, and then, contact holes are formed by patterning. Afterwards, Al is deposited thereon by sputtering so as to fill the contact holes, and, by patterning, the collector electrode 24, the emitter electrode 8, the drain electrode 28, and the wiring 9 connected to the conductive layer 6 are formed. [FIG. 6D]

Then, the PSG film 26 is formed by chemical vapor deposition, and, the Al layer is formed on this PSG film 26 by sputtering. The Al layer is so patterned as to form an opening for allowing light to enter the device. In this way, the shielding layer 27 is formed. [FIG. 6E]

A protective layer is provided on this shielding layer 27 and is connected to external leads by wire bonding using fine gold wires. Through encapsulation with a transparent resin by transfer molding, the manufacture of the semiconductor photoelectric conversion device is completed.

Then, by applying a predetermined level of negative electrical potential to the conductive layer 6, a p-type inversion layer is formed as shown in FIG. 3.

EXAMPLE

In accordance with the manufacturing method described above, a line sensor having one hundred cells was prepared. Each cell had an opening constituting the light receiving surface sized 14 μm × 63.5 μm. In this experimental construction, the epitaxial layer 3 had an impurity density of $2 \times 10^{14} cm^{-3}$; the inversion layer 2 had a thickness of 500Å; the insulating film 25 consisted of a silicon film having a thickness of 7,000Å; and the electrode was a polysilicon layer having a thickness of 500Å.

The voltage applied for the purpose of forming an inversion layer was −5V, and the voltage applied at the time of reading was +5V.

The line sensor thus constructed provided a sensitivity approximately twice higher than that of conventional line sensors.

Next, an example of an image reading apparatus to which this invention is to be applied will be described.

Figure 7:
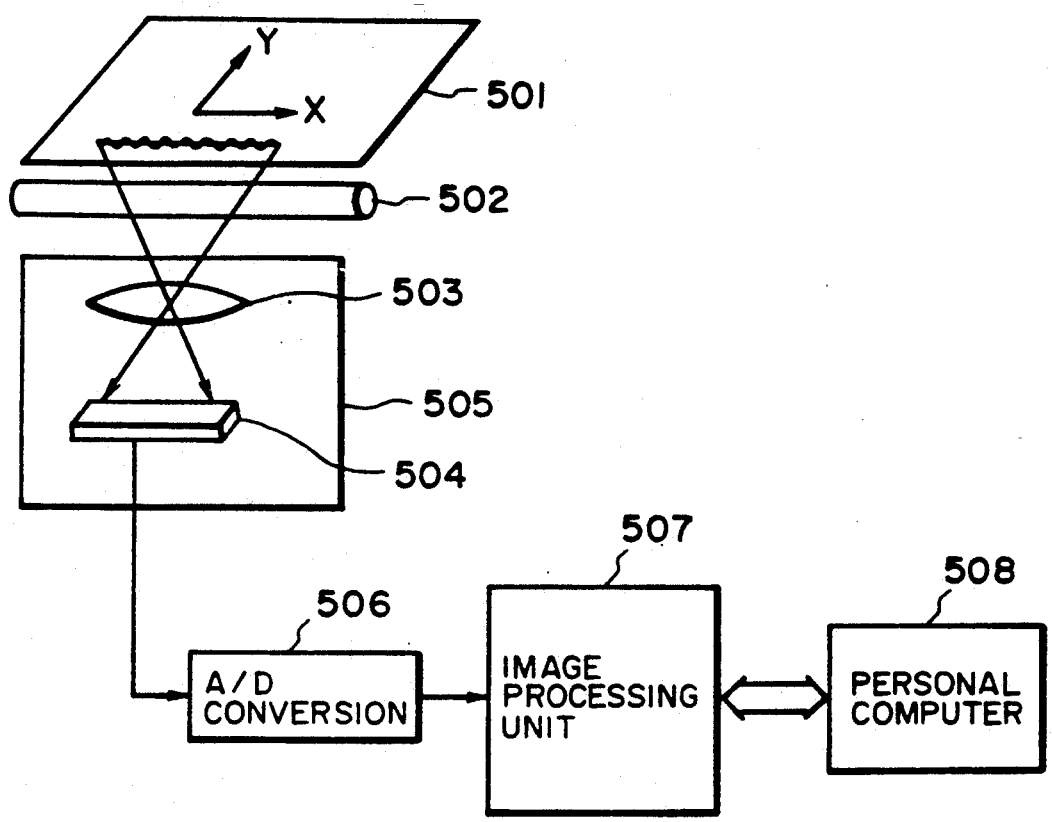
FIGS. 7 and 8 are schematic views showing the construction of examples of an image information processing apparatus.

FIG. 7 is a schematic view showing the construction of an example of such an image reading apparatus.

In the drawing, the reference numeral 501 indicates an original, which is moved mechanically in the direction indicated by the arrow Y with respect to a reading station 505. The reading of the image on the original 501 is effected by scanning it in the direction indicated by the arrow X by means of an image sensor 504.

Light from a light source 502 is reflected by the original 501, the reflected light forming an image on the image sensor 504 through an image forming optical system 503. This causes carriers corresponding to the intensity of the incident light to be accumulated on the image sensor 504. These carriers are subjected to photoelectric conversion and are output as an image signal.

This image signal is digitized by an AD converter 506 and supplied to memory in an image processing unit 507 as image data. The data is then subjected to various processes including shading compensation and color compensation before being transmitted to a personal computer 508 or a printer, etc.

When the transfer of the image signal obtained through X-direction scanning has been thus completed, the original 501 makes a relative movement in the Y-direction, and, by repeating the above operations, the image on the original 501 can be entirely converted into an electrical signal and extracted as image information.

As described above in detail, the photoelectric conversion device of this invention makes it possible to reduce the parasitic capacitance in the control electrode region, so that its output voltage is not lowered. As a result, this photoelectric conversion device can provide an enhanced output sensitivity.

Figure 8:
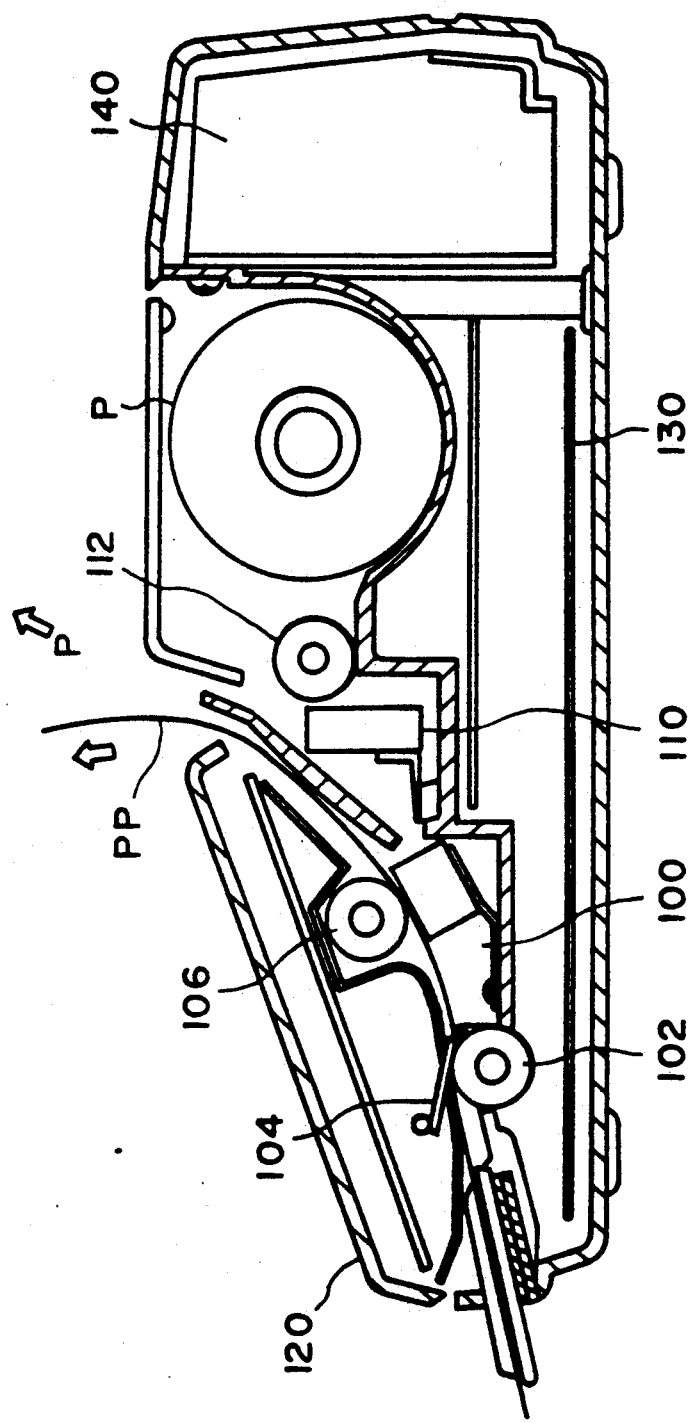

FIG. 8 shows a facsimile apparatus, which is an example of an image information processing apparatus to which the photoelectric conversion device of this invention is to be applied. This facsimile apparatus is composed of an elongated line sensor unit in which a plurality of photoelectric conversion devices in accordance with the above-described embodiment are arranged. The facsimile apparatus shown includes a sensor unit 100, a feeding roller 102 for feeding an original PP to the reading position, a separating member 104 which ensures that one sheet of original PP is fed at one time, and a platen roller 106 which is situated on the other side of the original PP with respect to the sensor unit 100, i.e., on the side where reading is effected, feeding the original PP while controlling the surface to be read of the original PP.

The reference symbol P indicates a recording medium which is in the form of a paper roll, on which is reproduced image information read by the sensor unit 100, or, in the case of a facsimile apparatus or the like, image information transmitted from outside. The reference numeral 110 indicates a recording head serving as the recording means for forming images. This recording head 110 may consist of a thermal head, an ink jet recording head, etc. Further, this recording head may be a serial type or a line type. The reference numeral 112 indicates a platen roller serving as a feeding means which feeds the recording medium P with respect to the recording position, where recording is effected by the recording head 110, and which, at the same time, controls that surface of the recording medium P on which recording is performed.

The reference numeral 120 indicates an operation panel, on which are arranged switches serving as the input/output means for receiving operational inputs as well as displays or the like for indicating the conditions of the apparatus through messages.

The reference numeral 130 indicates a system control board serving as the control means. Provided on this system control board are a controller for controlling the various sections of the apparatus, a drive circuit for photoelectric conversion elements, an image information processor, a transmission/reception section, etc. The reference numeral 140 indicates the power source for the apparatus.

U.S. Pat. Nos. 4,723,129 and 4,740,796 disclose the typical structural features and principle of preferable examples of the recording means to be used in the information processing apparatus of this invention. According to the system disclosed in the specifications of these U.S. patents, at least one driving signal which corresponds to information to be recorded and which causes a rapid increase in temperature exceeding nuclear boiling is applied to an electrothermal converter arranged in correspondence with a sheet retaining liquid (ink) in it or a liquid path, thereby generating thermal energy in this electrothermal converter. This causes film boiling to take place on the thermal operation surface of the recording head, with the result that a bubble is formed in the liquid (ink) in exact correspondence with this driving signal. Through the growth and contraction of this bubble, liquid (ink) is expelled through a discharge nozzle, forming at least one droplet.

Further, through an appropriate combination of a plurality of recording heads as disclosed in the patent specifications mentioned above, a full-line type recording head having a length corresponding to the maximum recording medium width that allows recording can be realized. Alternatively, the requisite recording head length may be obtained with a single, integrally formed recording head.

Furthermore, the present invention can be effectively applied to an apparatus using a renewable, tip-type recording head, which when attached to the apparatus, can be electrically connected thereto and supplied with ink therefrom, or a cartridge-type recording head with an integrally formed ink tank.

I claim:

1. A photoelectric conversion device comprising:
   a first semiconductor region of a first conductivity type having a photoelectric converting region;
   a second semiconductor region of a second conductivity type different from said first conductivity type for accumulating a photo-excited carrier;
   a third semiconductor region of said first conductivity type;
   light shielding means for shielding said second and third semiconductor regions from incident light;
   output means electrically connected to said third semiconductor region for supplying an output signal therefrom; and
   means for altering a capacitance between said second semiconductor region and said first semiconductor region.

2. A device according to claim 1, wherein said means for altering capacitance is an electrode to which a predetermined voltage is applied.

3. A device according to claim 1, wherein a plurality of said second and third semiconductor regions are provided.

4. A device according to claim 1, wherein said light shielding means is an aluminum layer.

5. A device according to claim 1, wherein said first semiconductor region is adjacent to a high impurity concentration region to which a predetermined voltage is applied.

6. An information processing apparatus comprising:
   a photoelectric conversion device comprising:
      a first semiconductor region of a first conductivity type having a photoelectric converting region;
      a second semiconductor region of a second conductivity type different from said first conductivity type for accumulating a photo-excited carrier;
      a third semiconductor region of said first conductivity type;
      light shielding means for shielding said second and third semiconductor regions from incident light;
      output means electrically connected to said third semiconductor region for supplying an output signal therefrom; and
      means for altering a capacitance between said second semiconductor region and said first semiconductor region;

signal processing means for processing the output signal supplied from said photoelectric conversion device to supply a processed output signal; and recording means for performing recording on the basis of the processed output signal supplied from said signal processing means.

7. An information processing apparatus according to claim 6, wherein said recording means includes an ink jet recording head which performs recording by utilizing thermal energy in expelling ink.

8. An information processing apparatus according to claim 6, wherein said image processing apparatus is a copying machine.

9. An information processing apparatus according to claim 6, wherein said image processing apparatus is a facsimile apparatus.

10. A photometric apparatus comprising:
a photoelectric conversion device comprising:
a first semiconductor region of a first conductivity type having a photoelectric converting region;
a second semiconductor region of a second conductivity type different from said first conductivity type for accumulating a photo-excited carrier;
a third semiconductor region of said first conductivity type;
light shielding means for shielding said second and third semiconductor regions from incident light;
output means electrically connected to said third semiconductor region for supplying an output signal therefrom; and
means for altering a capacitance between said second semiconductor region and said first semiconductor region; and signal processing means for processing the output signal supplied from said photoelectric conversion device.

11. A photometric apparatus according to claim 10, wherein said photometric apparatus is incorporated into a camera.

* * * * *

UNITED STATES PATENT AND TRADEMARK OFFICE
CERTIFICATE OF CORRECTION

PATENT NO. : 5,241,169

DATED : August 31, 1993

INVENTOR(S) : HAYAO OHZU

It is certified that error appears in the above-identified patent and that said Letters Patent is hereby corrected as shown below:

<u>COLUMN 8</u>

Line 8, "A1" should read --Al--.
Line 16, "A1" should read --Al--.

Signed and Sealed this

Twenty-sixth Day of April, 1994

Attest:

BRUCE LEHMAN

Attesting Officer     Commissioner of Patents and Trademarks